United States Patent [19]

Gotoh

[11] Patent Number: 4,907,974

[45] Date of Patent: Mar. 13, 1990

[54] METHOD OF GROWING A SEMICONDUCTOR DEVICE STRUCTURE

[75] Inventor: Yukio Gotoh, Itami, Japan

[73] Assignee: Mitsubishi Denki Kabushiki Kaisha, Japan

[21] Appl. No.: 145,544

[22] Filed: Jan. 19, 1988

[30] Foreign Application Priority Data

Feb. 13, 1987 [JP] Japan .................. 62-32004

[51] Int. Cl.$^4$ .............................. H01L 21/265
[52] U.S. Cl. .................. 437/129; 437/110; 437/126
[58] Field of Search ............... 437/129, 126, 128, 133, 437/81, 82; 372/45, 46, 50; 357/16, 17

[56] References Cited

U.S. PATENT DOCUMENTS

| | | | |
|---|---|---|---|
| 4,567,060 | 1/1986 | Hayakana | 437/129 |
| 4,569,721 | 2/1986 | Hayakawa | 437/129 |
| 4,635,343 | 1/1987 | Kureda | 437/133 |
| 4,660,208 | 4/1987 | Johnston, Jr. | 437/129 |
| 4,667,059 | 5/1987 | Olson | 437/5 |
| 4,706,255 | 11/1987 | Thorntan | 372/50 |
| 4,750,184 | 6/1988 | Kumabe | 372/45 |
| 4,769,821 | 9/1988 | Gatoh | 372/46 |
| 4,771,433 | 9/1988 | Kaneno | 372/45 |

FOREIGN PATENT DOCUMENTS

| | | | |
|---|---|---|---|
| 0020390 | 6/1978 | Japan | 437/133 |
| 0134988 | 10/1980 | Japan | 437/133 |
| 0043880 | 3/1985 | Japan | 437/133 |
| 0171242 | 2/1986 | Japan | 437/133 |

OTHER PUBLICATIONS

"MOCVD Growth of $(Al_xGa_{l-x})_yIn_{l-y}P$ and Double Heterostructures For Visible Light Lasers", I Hino et al., J. Crystal Growth 68 (1984), pp. 483–489.

Primary Examiner—Olik Chaudhuri
Assistant Examiner—Kevin McAndrews
Attorney, Agent, or Firm—Leydig, Voit & Mayer

[57] ABSTRACT

A semiconductor device includes a plurality of crystalline layers successively disposed directly on a substrate or on a buffer layer on the substrate and a getter layer comprising a metal of high activity disposed between the substrate or the buffer layer and the plurality of crystalline layers. An MO-CVD crystal growth method for growing a plurality of crystalline layers successively on a substrate or on a substrate having a buffer layer by supplying gases to a reaction tube containing a substrate includes growing a getter layer, including a metal of high activity for removing impurities, on the substrate or the buffer layer before growing a target crystalline layer.

2 Claims, 2 Drawing Sheets

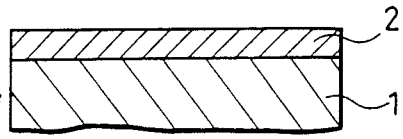
F I G .2(a).
(PRIOR ART)
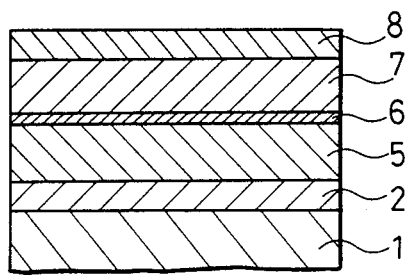
F I G .2(b).
(PRIOR ART)
F I G .3. (PRIOR ART)
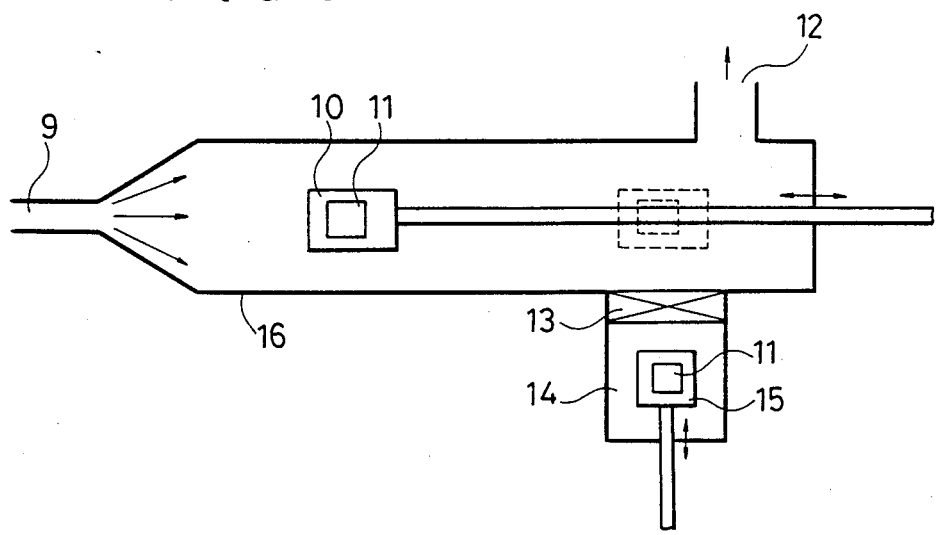

METHOD OF GROWING A SEMICONDUCTOR DEVICE STRUCTURE

FIELD OF THE INVENTION

The present invention relates to a crystal growth method with the use of MO-CVD method by which a high quality crystal is obtained, and a semiconductor device that is produced by such a method.

BACKGROUND ART

FIGS. 2(a) and (b) show a prior art crystal growth method for producing a light emission element, wherein FIG. 2(a) shows a cross-sectional structure of semiconductor layers before growing a double heterojunction structure, and FIG. 2(b) shows a cross-sectional structure of semiconductor layers after growing a double heterojunction structure.

In these figures, the reference numeral 1 designates a GaAs substrate, the numeral 2 designates a GaAs first buffer layer, the numeral 5 designates an AlGaInP first cladding layer, the numeral 6 designates a GaInP active layer, the numeral 7 designates an AlGaInP second cladding layer, and the numeral 8 designates a GaAs contact layer.

Usually, the growth of an AlGaInP series double heterojunction structure by the use of an MO-CVD method is conducted in accordance with the following production process.

At first, as shown in FIG. 2(a), a GaAs first buffer layer 2 is grown on a GaAs substrate 1. Next, as shown in FIG. 2(b), an AlGaInP first cladding layer 5, a GaInP active layer 6, an AlGaInP second cladding layer 7, and a GaAs contact layer 8 are successively grown on the GaAs first buffer layer 2.

When the growth of an AlGaInP series double heterostructure is conducted by such a process, many defects occur in the growing layer because impurities such as oxygen or moisture enter the reaction tube when a wafer is mounted on a susceptor. These impurities are adsorbed on the susceptor surface or the reaction tube wall. It is difficult to remove these impurities even by hydrogen purging or the like.

As means for reducing air contamination when mounting the wafer in an MO-CVD method, a so-called air lock system is usually employed.

FIG. 3 is a schematic diagram showing an MO-CVD apparatus provided with such an air lock system.

In FIG. 3, the reference numeral 9 designates a gas introduction aperture, the numeral 10 designates a susceptor, the numeral 11 designates a wafer, the numeral 12 designates an exhaust aperture, the numeral 13 designates a gate valve, the numeral 14 designates a wafer exchange room, the numeral 15 designates a wafer exchange instrument, and the numeral 16 designates a reaction tube.

In this MO-CVD apparatus provided with an air lock system, at first the wafer 11 is introduced into the wafer exchange room 14, and the introduced wafer 11 is sufficiently purged therein. Next, the gate valve 13 is opened, the susceptor 10 and wafer exchange instrument 15 are moved, and the wafer 11 is mounted onto the susceptor 10. Thus, the mounting of the wafer 11 is conducted without the reaction tube 16 and the susceptor 10 being exposed to air.

In this air lock system employed in the prior art crystal growth method, however, the configuration and number of wafers 11 are restricted because the mounting of the wafer 11 is conducted by a machine, and it takes a relatively long time for the apparatus to equilibrate after mounting or removing a wafer. Furthermore, impurities attached to the wafer 11 themselves cannot be removed. The air lock system apparatus is also expensive.

SUMMARY OF THE INVENTION

An object of the present invention is to provide an improved crystal growth method capable of mounting a wafer without using an air lock system and capable of obtaining a high quality crystal by completely removing the residual impurities.

Another object of the present invention is to provide a semiconductor device by the crystal growth method of the present invention.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a getter layer including a metal of high activity for removing impurities is grown on a substrate or on a substrate having a buffer layer before growing a target crystalline layer in a crystal growth method. Thus, impurities in the reaction tube are easily removed, and a high quality crystal is obtained.

According to another aspect of the present invention, a semiconductor device including a plurality of crystalline layers is successively deposited on a substrate directly or on a buffer layer, with a getter layer comprising a metal of high activity disposed on the substrate or the buffer layer .

BRIEF DESCRIPTION OF THE DRAWINGS

FIGS. 2a and 2b are diagrams showing a prior art crystal growth method for producing a light emission element; and FIG. 3 is a schematic diagram showing an MO-CVD apparatus provided with an air lock system.

DETAILED DESCRIPTION OF THE PREFERRED EMBODIMENTS

Figure 1A:
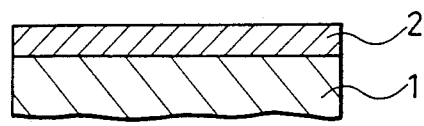
FIGS. 1(a), 1(b), and 1(c) are sectional views of structures according to an embodiment of the present invention.
Figure 1B:
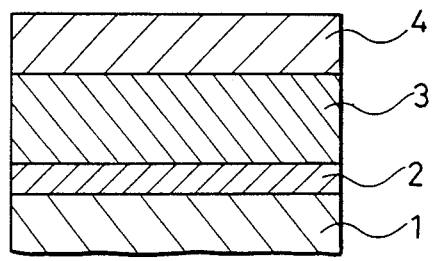
Figure 1C:
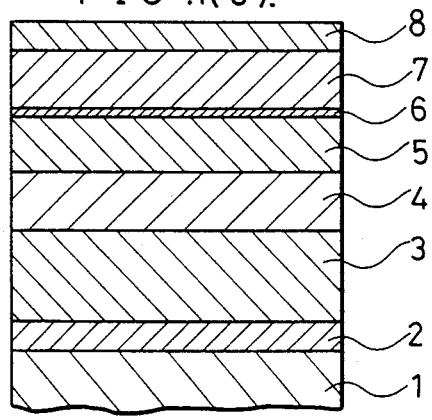

FIGS. 1(a) to (c) show a crystal growth method according to an embodiment of the present invention, wherein figure 1(a) shows a cross-sectional structure of semiconductor layers before growing an AlGaAs getter layer, figure 1(b) shows a cross-sectional structure of semiconductor layers after growing an AlGaAs getter layer and a GaAs second buffer layer, and FIG. 1(c) shows a cross-sectional structure of semiconductor layers after growing an AlGaInP double heterojunction structure.

In these figures, the same reference numerals designate the same elements as those shown in figure 2(a) and (b). The reference numeral 3 designates an AlGaAs getter layer which includes a metal of high activity such as Al for removing impurities .

The growth processes of the respective layers of an AlGaInP series semiconductor laser by an MO-CVD apparatus that is not provided with an air lock system is described in the following.

At first, as shown in FIG. 1(a), a GaAs first buffer layer 2 is grown on a GaAs substrate 1. Then, residual impurities still remain in the reaction tube. Next, as shown in FIG. 1(b), an AlGaAs getter layer 3 is grown on the GaAs first buffer layer 2. During this growth, trimethyl-aluminum or aluminum as a material of extremely high activity reacts with the residual impurities such as oxygen or moisture and combines therewith. The impurities combined as such are taken into the AlGaAs getter layer 3 or exhausted to the outside of the reaction tube. Thus, the residual impurities in the reaction tube are reduced.

In this way, since aluminum or its organic compound is high in reactivity and the susceptor or the like is maintained at a high temperature during the growth of the AlGaAs getter layer 3, molecular activity of the residual impurities increases, and the reaction of aluminum and its organic compound with the impurities is promoted.

Next, a GaAs second buffer layer 4 is grown on the AlGaAs getter layer 3 to avoid any deterioration in crystallinity that is caused by the residual impurities included in the AlGaAs getter layer 3.

Next, as shown in FIG. 1(c), an AlGaInP first cladding layer 5, a GaInP active layer 6, an AlGaInP second cladding layer 7, and a GaAs contact layer 8 are successively grown on the GaAs second buffer layer 4, thereby realizing an AlGaInP double heterojunction structure having of good crystallinity.

An AlGaInP series double heterojunction structure can be also realized by growing the AlGaAs getter layer 3 directly on the GaAs substrate 1 without first depositing the GaAs first buffer layer 2. Thereafter growing the respective layers beginning from the GaAs second buffer layer 4 are grown.

In the above-illustrated embodiment, a crystal growth method of an AlGaInP series semiconductor laser is described, but the present invention can be applied to an AlGaAs or an AlGaAs series semiconductor laser, and further to other semiconductor elements such as a light emission diode, a photo diode, or a HEMT.

Furthermore, AlGaInP, AlInP, AlAs, or AlInAs can be used as the material of the getter layer with the same effects as described above. Metals other than Al can be also used as a metal of high activity.

As is evident from the following description, according to the present invention, a getter layer including a metal of high activity for removing impurities is grown on a substrate or on a substrate having a buffer layer before growing a target crystalline layer, whereby impurities in the reaction tube are easily removed, and a high quality crystal is obtained.

What is claimed is:

1. A method of making a crystalline semiconductor device including a plurality of compound semiconductor layers, at least one of said layers including an element such as Al that can react with impurities such as oxygen during the crystal growth thereof, thereby harming the electronic properties of that layer comprising:

growing directly on a surface of a GaAs substrate a layer of

AlGaAs as a getter layer for reacting with and removing impurities from the ambient during growth of the layer;

growing a layer of GaAs directly on and covering said getter layer as a first buffer layer; and successively growing as a laser structure on said first buffer layer layers of AlGaInP, GaInP, and AlGaInP.

2. The method of claim 1 including growing a second buffer layer of GaAs on said GaAs substrate as the surface of the substrate on which said getter layer is grown.

* * * * *